(12) United States Patent
Mirzaei et al.

(10) Patent No.: US 8,929,844 B2
(45) Date of Patent: Jan. 6, 2015

(54) VARIABLE GAIN CONTROL TRANSFORMER AND RF TRANSMITTER UTILIZING SAME

(75) Inventors: Ahmad Mirzaei, San Diego, CA (US); Hooman Darabi, Laguna Niguel, CA (US)

(73) Assignee: Broadcom Corporation, Irvine, CA (US)

(*) Notice: Subject to any disclaimer, the term of this patent is extended or adjusted under 35 U.S.C. 154(b) by 487 days.

(21) Appl. No.: 12/807,210

(22) Filed: Aug. 30, 2010

(65) Prior Publication Data

US 2012/0052824 A1    Mar. 1, 2012

(51) Int. Cl.
*H04B 1/04*    (2006.01)
*H01F 27/42*    (2006.01)
*H03F 3/21*    (2006.01)
*H03F 3/24*    (2006.01)

(52) U.S. Cl.
CPC .............. *H01F 27/42* (2013.01); *H03F 3/211* (2013.01); *H03F 3/245* (2013.01); *H03F 2200/537* (2013.01)
USPC .......................................... 455/127.2; 455/91

(58) Field of Classification Search
CPC .... H01B 1/44; H01B 2203/5483; H01B 3/56; H01B 1/30; H01B 1/406; H04M 19/001; H04M 3/005; H04M 19/04; H04M 1/02; H04M 1/6033; H04M 1/62; H04M 3/64; H03G 3/00; H03F 3/211; H03F 3/19; H03F 3/193; H03F 2200/537; H03F 2200/541; H03F 2200/421; H03F 3/72; H03F 2200/378; H03F 2200/414; H03F 2200/417; H03F 2203/45544; H03F 2203/45551; H03F 2203/45631; H03F 2203/45634; H03F 2203/45726; H03F 3/245; H03F 1/086; H03F 1/14; H03F 2200/451; H03F 2203/30144; H03F 3/3022; H03F 3/2175; H01F 38/12; H01F 27/40; H01F 38/30; H01F 17/04; H01F 27/284; H01F 27/42; H01F 27/06; H02H 3/33; H01H 83/04; G01R 27/02; A61N 1/32; H02B 7/08; H04B 1/50; H04B 1/68
USPC ................... 455/127.1–127.5, 114.3, 91–129; 330/277; 361/268–270
See application file for complete search history.

(56) References Cited

U.S. PATENT DOCUMENTS

| | | | | |
|---|---|---|---|---|
| 3,652,948 A * | 3/1972 | Fierstien et al. | ........... | 455/127.1 |
| 4,591,795 A * | 5/1986 | McCorkle | ................... | 455/127.2 |
| 4,701,722 A * | 10/1987 | Dolby | .............................. | 333/14 |
| 4,904,921 A * | 2/1990 | DeVito et al. | ............. | 324/207.18 |
| 5,777,468 A * | 7/1998 | Maher | ....................... | 324/207.18 |

(Continued)

*Primary Examiner* — Lana N Le
(74) *Attorney, Agent, or Firm* — Oblon, Spivak, McClelland, Maier & Neustadt, L.L.P.

(57) ABSTRACT

According to one embodiment, a variable gain control transformer comprises a primary winding connected to differential inputs of the variable gain control transformer, a secondary winding for providing a single ended output to a load, and an output control circuit coupled to the secondary winding, the output control circuit configured to provide up to approximately 12 dB of gain control. Variable gain control may be achieved using first and second variable resistors of the output control circuit, wherein the first and second variable resistors are implemented by respective first and second pluralities of source-drain resistances produced by respective corresponding first and second pluralities of selectable field-effect transistors (FETs). In one embodiment, the variable gain control transformer further comprises a variable capacitance tuning circuit coupled between the differential inputs, the variable capacitance tuning circuit implemented using a plurality of selectable fixed capacitance unit cells.

19 Claims, 6 Drawing Sheets

(56) References Cited

U.S. PATENT DOCUMENTS

| | | | |
|---|---|---|---|
| 6,046,641 A * | 4/2000 | Chawla et al. | 330/277 |
| 6,664,941 B2 * | 12/2003 | Itakura et al. | 455/91 |
| 6,864,808 B2 * | 3/2005 | McBrien | 455/127.1 |
| 6,960,945 B1 * | 11/2005 | Bonin | 327/111 |
| 7,477,187 B2 * | 1/2009 | Rofougaran | 455/556.1 |
| 7,768,350 B2 * | 8/2010 | Srinivasan et al. | 330/253 |
| 8,139,328 B2 * | 3/2012 | DiSalvo et al. | 361/42 |
| 8,244,194 B2 * | 8/2012 | Morgan et al. | 455/188.1 |
| 2008/0003960 A1 * | 1/2008 | Zolfaghari | 455/127.3 |
| 2009/0073070 A1 * | 3/2009 | Rofougaran | 343/793 |
| 2010/0090760 A1 * | 4/2010 | Bachmann | 327/586 |
| 2011/0074509 A1 * | 3/2011 | Samavedam et al. | 330/253 |
| 2014/0087672 A1 * | 3/2014 | Mostov et al. | 455/78 |

* cited by examiner

500

| TX Modes | CN1 | CN2 | CN3 | CN4 | CN5 |
|---|---|---|---|---|---|
| EDGE/ GSM | LOW 462 OFF | LOW 464 ON | LOW 452a and 452c OFF | LOW 452b and 452d OFF | HIGH 466 OFF |
| WCDMA Maximum Gain | HIGH 462 ON | HIGH 464 OFF | LOW 452a and 452c OFF | LOW 452b and 452d OFF | LOW 466 ON |
| WCDMA 6dB Gain Control | LOW 462 OFF | HIGH 464 OFF | HIGH 452a and 452c ON | LOW 452b and 452d OFF | HIGH 466 OFF |
| WCDMA 12dB Gain Control | LOW 462 OFF | HIGH 464 OFF | LOW 452a and 452c OFF | HIGH 452b and 452d ON | HIGH 466 OFF |

VARIABLE GAIN CONTROL TRANSFORMER AND RF TRANSMITTER UTILIZING SAME

BACKGROUND OF THE INVENTION

1. Field of the Invention

The present invention is generally in the field of electronic circuits and systems. More specifically, the present invention is in the field of communications circuits and systems.

2. Background Art

Transceivers are typically used in communications systems to support transmission and reception of communications signals through a common antenna, for example at radio frequency (RF) in a cellular telephone or other mobile communication device. A transmitter routinely implemented in such a transceiver in the conventional art may utilize several processing stages to condition and preamplify a transmit signal prior to passing the transmit signal to a power amplifier (PA). For example, the transmit signal may originate as a digital signal generated by a digital block of the transmitter. That digital signal is then typically converted into an analog baseband signal, by means of a digital-to-analog converter (DAC) for instance. The analog baseband signal may then be filtered using a low-pass filter (LPF) and up-converted to RF by a mixer, which is usually implemented as an active circuit. Subsequently, the up-converted signal can be processed by a PA driver, which then passes the preamplified transmit signal to the PA for final amplification and transmission from the transceiver antenna In a conventional transmitter preamplification chain, pre-amplification gain control may be approximately evenly distributed between lower frequency gain control stages implemented prior to, or in combination with up-conversion, and higher frequency gain control stages after up-conversion. In that conventional design approach, the DAC, LPF, and mixer circuits may collectively contribute a significant portion of the overall gain control, such as approximately fifty percent of the preamplification gain control, for example. Unfortunately, this conventional approach to providing preamplification gain control is fraught with significant disadvantages, owing in part to the substantial inefficiencies resulting from the time and iterative testing required to coordinate calibration amongst the various lower frequency and higher frequency gain control stages.

Despite the disadvantages associated with conventional approaches, those approaches remain in widespread use due to the challenges posed by achieving adequate transmitter pre-amplification gain control at higher frequency using the PA driver stages alone. In order to overcome those challenges, it is desirable to obtain some gain control contribution from each stage of the PA driver, including its output stage to the PA. Thus, there is a need to overcome the drawbacks and deficiencies in the art by providing a variable gain control transformer for implementation as an output transformer of an RF transmitter PA driver and suitable for use in a more modern mobile communication device.

SUMMARY OF THE INVENTION

The present invention is directed to a variable gain control transformer and RF transmitter utilizing same, substantially as shown in and/or described in connection with at least one of the figures, and as set forth more completely in the claims.

DETAILED DESCRIPTION OF THE INVENTION

The present invention is directed to a variable gain control transformer and RF transmitter utilizing same. Although the invention is described with respect to specific embodiments, the principles of the invention, as defined by the claims appended herein, can obviously be applied beyond the specifically described embodiments of the invention described herein. Moreover, in the description of the present invention, certain details have been omitted in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
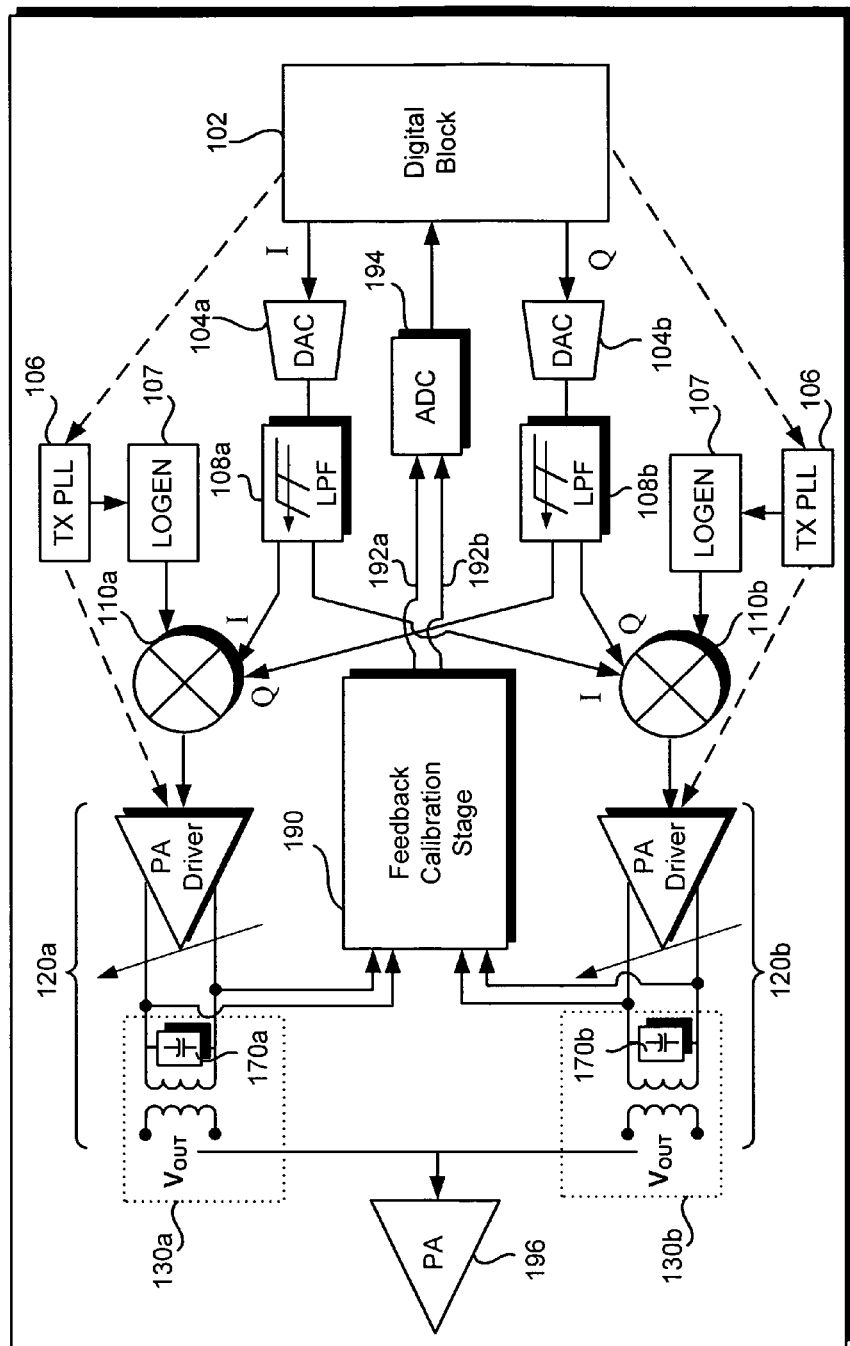
FIG. 1 is a block diagram of a transmitter including a power amplifier (PA) driver utilizing a variable gain control transformer, according to one embodiment of the present invention.

FIG. 1 shows a block diagram of transmitter 100 including a power amplifier (PA) driver implementing a variable gain control transformer, according to one embodiment of the present invention capable of overcoming the disadvantages associated with conventional designs. As may be seen from FIG. 1, transmitter 100 may be configured to support multiple transmission modes and/or multiple transmission frequencies. For example, transmitter 100 can be configured to support high-band transmission frequencies in a range between approximately 1.8 GHz and 2.2 GHz, as well as low-band transmission frequencies ranging between approximately 0.8 GHz and 1.1 GHz. It is noted that the implementational arrangement shown in FIG. 1, as well as the circuits represented by FIGS. 2, 3, 4A, and 4B of the present application, are for the purpose of assisting in the understanding of and conveying various concepts of the present invention. Elements shown in those figures are representations of physical and electrical elements used in implementing various embodiments of the present invention.

As shown in FIG. 1, transmitter 100 includes PA 196, which can be coupled to an antenna utilized by transmitter 100 (antenna not shown in FIG. 1). As further shown in FIG. 1, transmitter 100 includes a front-end comprising digital block 102 providing in-phase (I) and quadrature phase (Q) output signals, such as baseband signals, for example, to respective digital-to-analog converters (DACs) 104a and 104b. In addition, and as also shown in FIG. 1, transmitter 100 includes adjustable low-pass filters (adjustable LPFs) 108a and 108b. To support high-band frequency channels as well as low-band frequency channels, transmitter 100 includes high-band mixer 110a and low-band mixer 110b, which may be implemented as passive circuits, for example. In addition, transmitter 100 includes high-band variable gain control PA driver 120a and low-band variable gain control PA driver 120b.

As further shown in FIG. 1, high-band variable gain control PA driver 120a and low-band variable gain control PA driver 120b comprise respective variable gain control transformers 130a and 130b including respective variable capacitance tuning circuits 170a and 170b. Each of variable gain control transformers 130a and 130b includes a primary winding for receiving differential input signals from an amplification circuit of its respective PA driver, as well as a secondary winding to provide a preamplified transmit signal as a single-ended output to PA 196.

Also shown in FIG. 1 are transmitter phase-locked loop (TX PLL) 106 and local oscillator generator (LOGEN) 107, as well as differential feedback calibration stage 190 providing calibration feedback data 192a and 192b to digital block 102 through analog-to-digital converter (ADC) 194. It is noted that although TX PLL 106 and LOGEN 107 are shown in duplicate in FIG. 1 for the purposes illustrative clarity, in practice, a single combination of TX PLL 106 and LOGEN 107 can be coupled to both respective high-band and low-band variable gain control PA drivers 120a and 120b, and can be shared by respective high-band and low-band mixers 110a and 110b as well. It is further noted that although the embodiment of FIG. 1 characterizes baseband signal generation as being to performed digitally by digital block 102, that need not be the case in all embodiments. Thus, digital block 102 may be seen to correspond more generally to any suitable baseband signal generator.

According to the embodiment of FIG. 1, substantially all of the preamplification gain control required for transmitter 100, such as approximately 80 dB, or more, of preamplification gain control, can be provided by each of variable gain control PA drivers 120a and 120b at high frequency, e.g., after up-conversion by respective high-band and low-band mixers 110a and 110b. Moreover, variable gain control transformers 130a and 130b can be configured to provide up to approximately 12 dB of the preamplification gain control provided by their respective PA drivers. In addition, each of variable gain control transformers 130a and 130b can be further configured to substantially match the input impedance of its load. For example PA 196, which loads variable gain control transformers 130a and 130b, may present an input impedance of approximately fifty ohms (50Ω), and variable gain control transformers 130a and 130b can be configured to substantially match that input impedance value while providing up to approximately 12 dB of gain control.

As mentioned above, the embodiment of FIG. 1 may be implemented to support multiple transmission modes, such as transmission modes employing quadrature modulation schemes and transmission modes employing polar modulation, for example. For instance, in FIG. 1, transmission modes employing quadrature modulation can be associated with the solid line signal paths linking I and Q outputs of digital block 102 to variable gain control PA drivers 120a and 120b through respective DAC/adjustable LPF/mixer combinations 104ab/108ab/110a and 104ab/108ab/110b. Analogously, transmission modes employing polar modulation can be associated with the dashed line signal paths linking digital block 102 to variable gain control PA drivers 120a and 120b through TX PLL 106. In one embodiment, at least one of the multiple transmission modes operable using transmitter 100 supports both data-band and voice-band communications.

It is noted that although some of the pre-PA signal paths shown in FIG. 1 are represented by single lines for simplicity, many of those signals can comprise paired differential signals. Thus, the I and Q outputs of digital block 102 passed to respective high-band and low-band mixers 110a and 110b, the outputs of respective high-band and low-band mixers 110a and 110b, the polar mode outputs of digital block 102 passed to variable gain control PA drivers 120a and 120b through TX PLL 106, and the feedback calibration signal returned to digital block 102 by ADC 194, for example, can comprise differential signals. Thus, variable gain control PA driver 120a and 120b may be differentially driven. It is further noted that the signal paths internal to variable gain control PA drivers 120a and 120b, as well as the feedback signals provided by those variable gain control PA drivers to differential feedback calibration stage 190 and the calibration feedback data 192a and 192b output by feedback calibration stage 190 are explicitly shown as differential signals.

As further shown in FIG. 1, the I and Q signal paths provided by respective DACs 104a and 104b and adjustable LPFs 108a and 108b can be shared between the high-band and low-band transmission signals. In addition, a single implementation of each of digital block 102, TX PLL 106, LOGEN 107, feedback calibration stage 190, ADC 194, and PA 196 may be used to support all transmission modes and all transmission frequency bands. Moreover, variable gain control transformers 130a and 130b may be used to support all transmission modes for the respective high-band and low-band transmission frequency bands. Consequently, transmitter 100 is characterized by a compact space saving architecture that may be particularly well suited to meet increasingly fine dimensional and lower power consumption constraints as fabrication technologies transition to the 40 nm node, for example, and beyond.

Transmitter 100 may be implemented as part of a communications transceiver, for example, utilized in a cellular telephone or other mobile communication device operating at RF, such as in a frequency range from approximately 0.8 GHz to approximately 2.2 GHz. Moreover, in one embodiment, transmitter 100 can be implemented as part of a transceiver integrated circuit (IC) fabricated on a single semiconductor wafer or die using a 40 nm process technology, for example.

Figure 2:
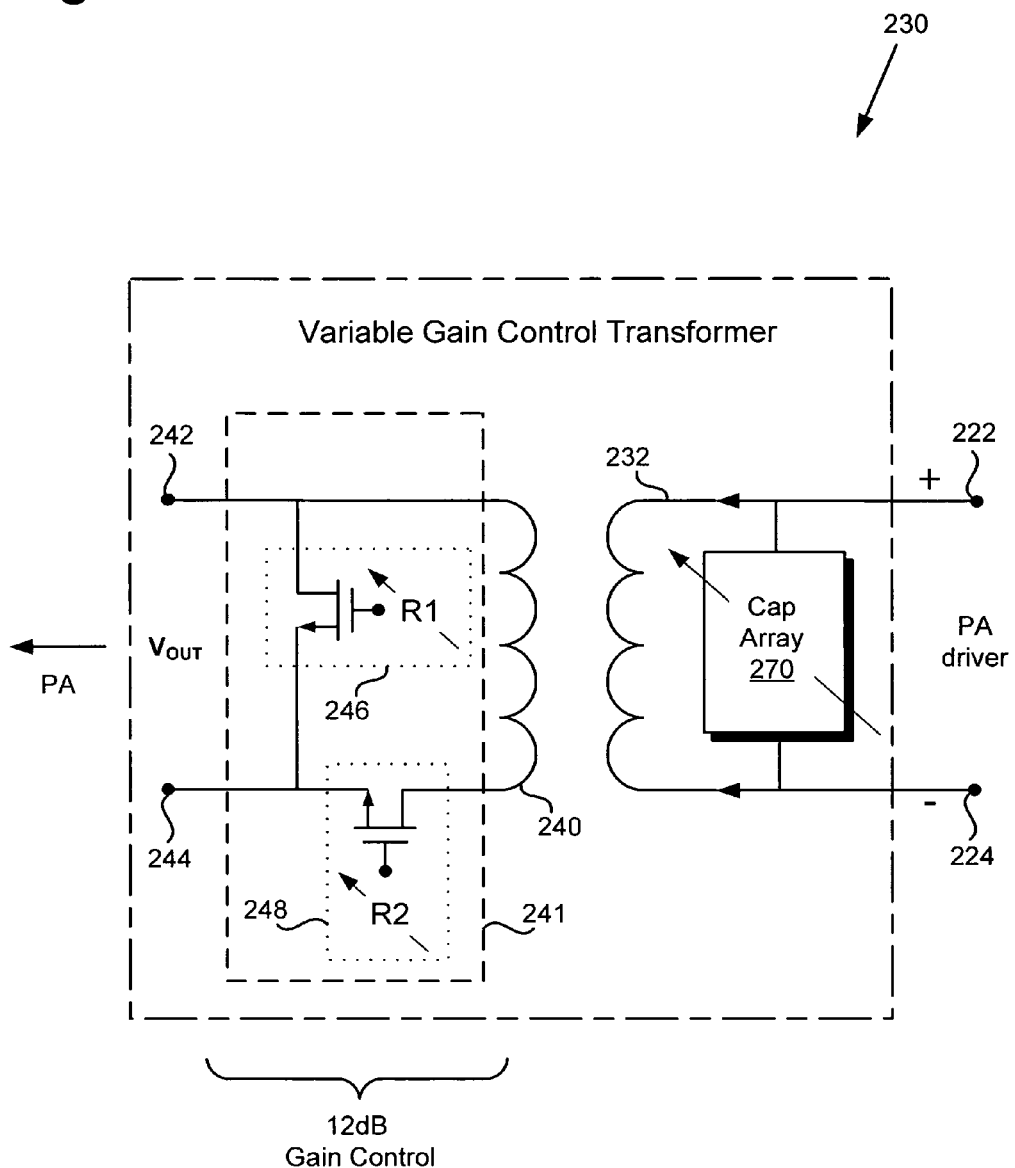
FIG. 2 is a block diagram of a variable gain control transformer suitable for implementation as an output stage of a PA driver, according to one embodiment of the present invention.
Figure 3:
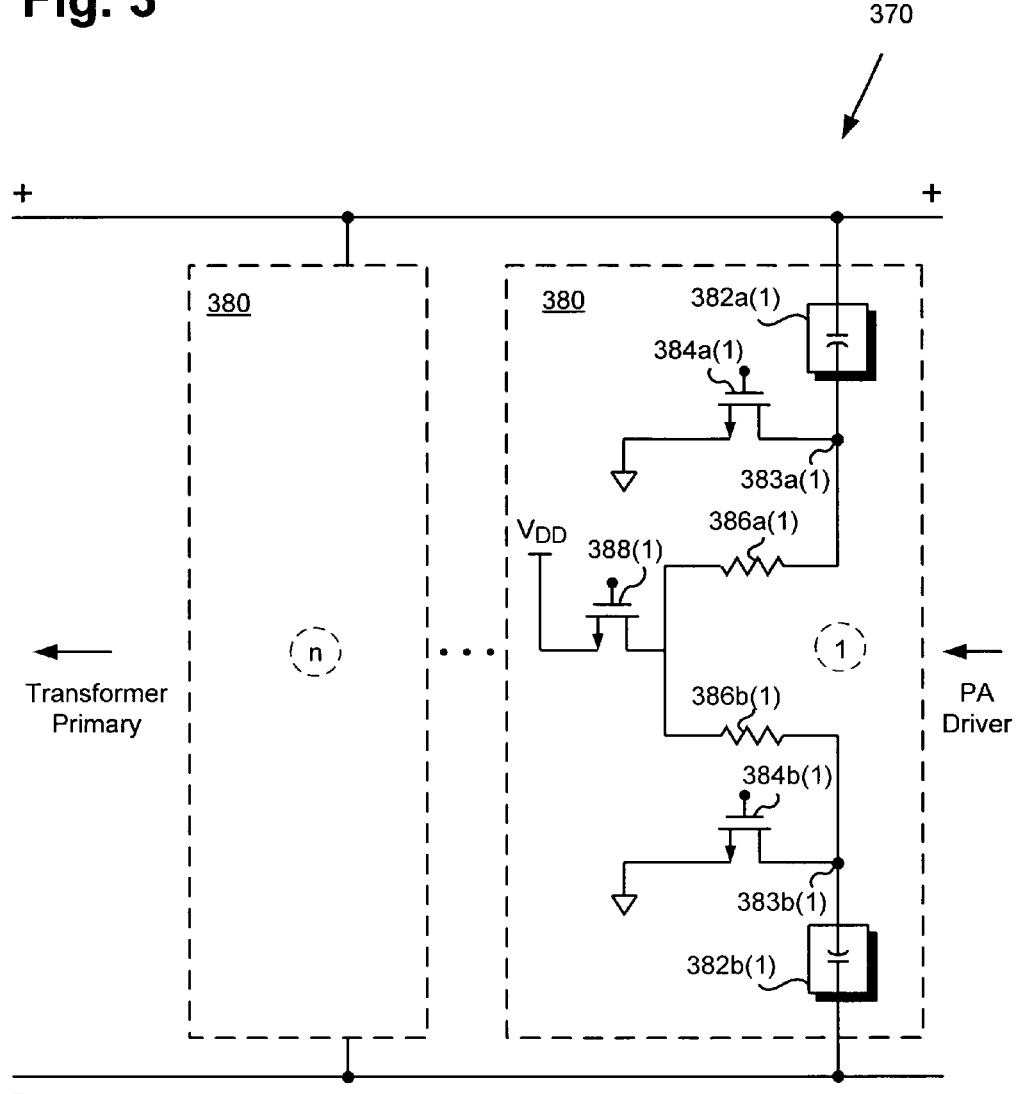
FIG. 3 is a block diagram of a variable capacitance tuning circuit suitable for implementation as part of a variable gain control transformer, according to one embodiment of the present invention.
Figure 4A:
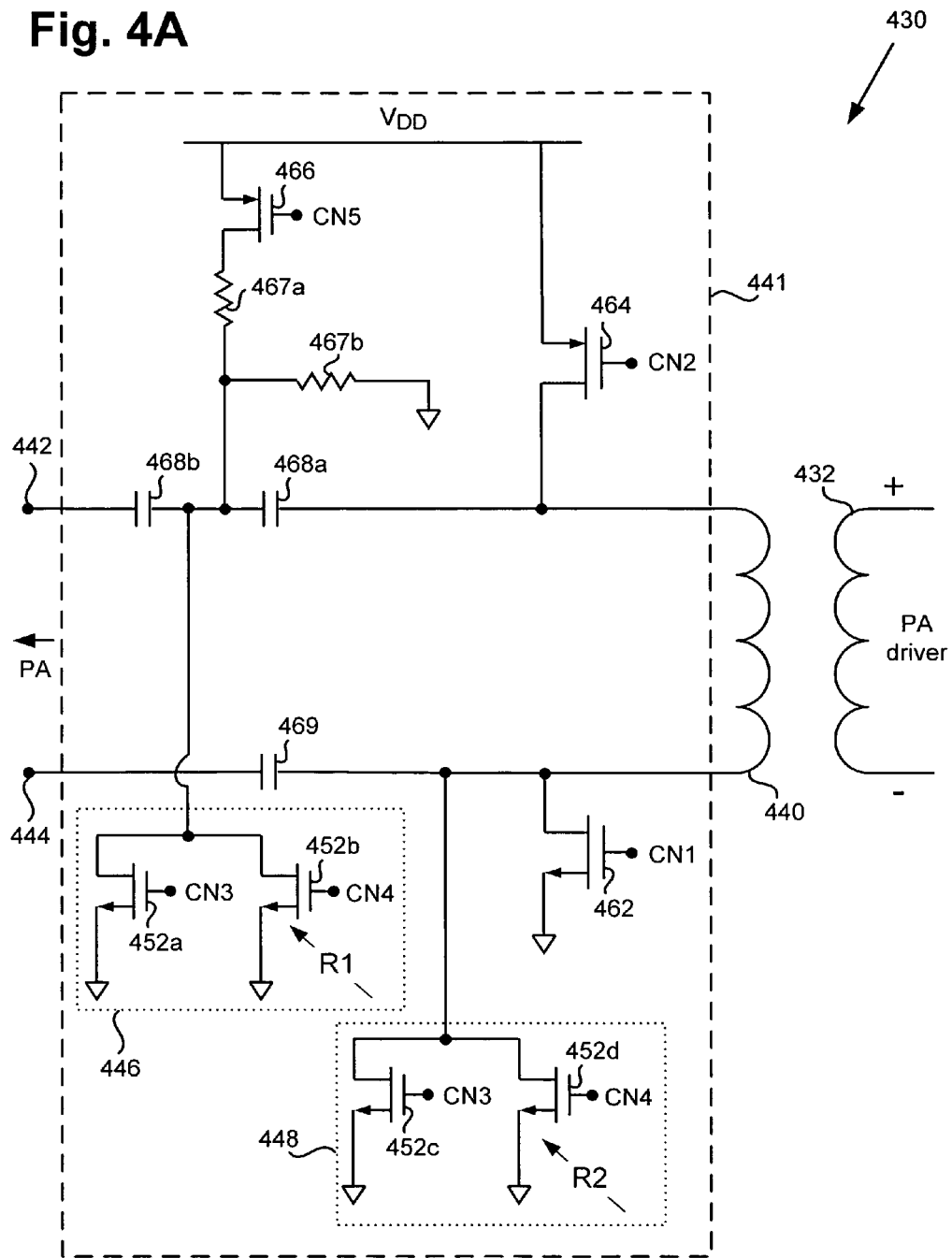
FIG. 4A is a diagram showing elements of an output control circuit suitable for implementation as part of a variable gain control transformer, according to one embodiment of the present invention.
Figure 4B:
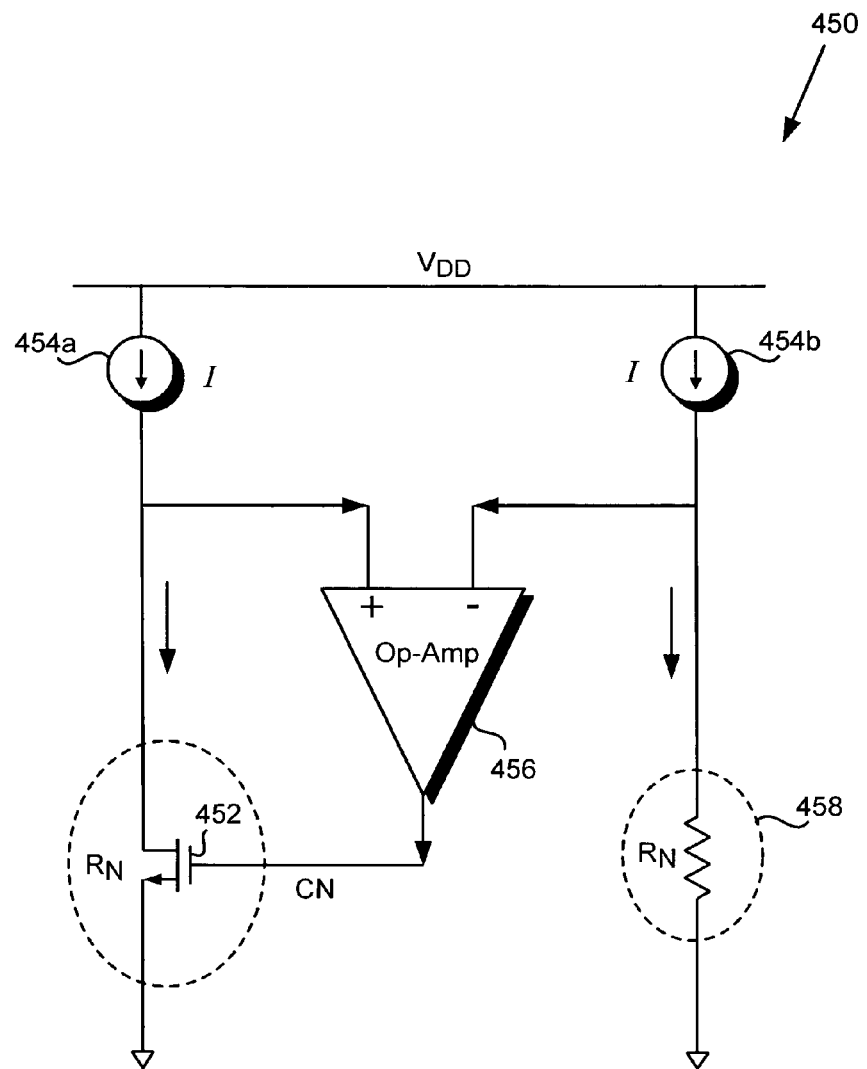
FIG. 4B is a diagram showing a sub-circuit for producing a variable resistance used in the output control circuit of FIG. 4A, according to one embodiment of the present invention.

Turning now to FIGS. 2, 3, 4A, and 4B, those figures show an exemplary variable gain control transformer and variable gain control transformer constituent circuits in greater detail, according to embodiments of the present invention. For example, FIG. 2 is a representation of a variable gain control transformer and FIG. 3 shows an example of a variable capacitance tuning circuit suitable for implementation in the variable gain control transformer of FIG. 2, according to embodiments of the present invention. Moreover, FIG. 4A shows an output control circuit implemented as part of a variable gain control transformer, while FIG. 4B shows a high-precision resistor implemented using the source-drain resistance presented by the controlled operation of a field-effect transistor (FET), according to embodiments of the present invention.

Referring first to FIG. 2, FIG. 2 shows a block diagram of elements of variable gain control transformer 230, which can be seen to correspond to either or both of variable gain control transformers 130a and 130b, in FIG. 1. Variable gain control transformer 230, in FIG. 2, includes a variable capacitance tuning circuit shown as cap array 270, which corresponds to either or both of variable capacitance tuning circuits 170a and 170b, in FIG. 1. As shown in FIG. 2, variable gain control transformer 230 also includes primary winding 232 connected to differential inputs 222 and 224 of variable gain control transformer 230, and receiving differential inputs from an amplification circuit of a PA driver, such as a transconductance amplifier or current steering block of one of PA drivers 120a and 120b in FIG. 1 (amplification circuit and PA driver not explicitly shown in FIG. 2).

As further shown in FIG. 2, variable gain control transformer 230 also includes secondary winding 240 and output control circuit 241 including variable resistors 246 and 248 coupled to secondary winding 240. Also shown in FIG. 2 are outputs 242 and 244 for selectably providing a single-ended output to a PA, such as PA 196, in FIG. 1 as $V_{OUT}$ (PA also not explicitly shown in FIG. 2), wherein one or the other of outputs 242 and 244 are selected according to the transmission mode being used by transmitter 100, in FIG. 1.

For example, when used to support a first transmission mode, such as Wideband Code Division Multiple Access (W-CDMA), a single-ended output may be taken from output 242 of variable gain transformer 230, while output 244 is grounded. Alternatively, when used to support another transmission mode, such as Global System for Mobile communications (GSM) or Enhanced data rates for GSM Evolution (EDGE), for example, a single-ended output may be taken from output 244 of variable gain transformer 230, while output 242 is grounded. Thus, variable gain control transformer 230 can be configured to selectably support multiple transmission modes providing voice-band and data-band communications when implemented as part of a PA driver in an RF transmitter, e.g., transmitter 100, in FIG. 1.

Gain control for variable gain control transformer 230, in FIG. 2, may be provided by output control circuit 241, which may be configured to provide up to approximately 12 dB of gain control, for example. Output control circuit 241 can provide variable gain control through use of variable resistors 246 and 248, as will be further described below in conjunction with FIGS. 4A and 4B. Moreover, in order to support the multiple transmission modes of transmitter 100, in FIG. 1, as described above, it is desirable that variable gain transformer 230 be tunable. That tuning function may be provided by cap array 270 coupled between differential inputs 222 and 224 of variable gain control transformer 230 and configured to operate as a variable capacitance tuning circuit for variable gain control transformer 230. The operation of cap array 270 is described in greater detail in conjunction with FIG. 3.

Referring to FIG. 3, FIG. 3 is a block diagram showing variable capacitance tuning circuit 370 suitable for implementation as part of a variable gain control transformer, such as variable gain control transformers 130a and 130b in FIG. 1, or variable gain control transformer 230 in FIG. 2, according to one embodiment of the present invention. Variable capacitance tuning circuit 370 corresponds to either or both of variable capacitance tuning circuits 170a and 170b, in FIG. 1, as well as to cap array 270, in FIG. 2.

According to the embodiment shown in FIG. 3, variable capacitance tuning circuit 370 comprises "n" selectable fixed capacitance unit cells 380, each coupled between differential inputs to the transformer primary, e.g., between differential inputs 222 and 224 of variable gain control transformer 230, in FIG. 2. Each selectable fixed capacitance unit cell 380, in FIG. 3, includes first and second fixed unit capacitors 382a and 382b, each having a corresponding plate selectably coupled to ground by respective first and second switches 384a and 384b. As further shown in FIG. 3, for each selectable fixed capacitance unit cell 380, node 383a is shared by fixed unit capacitor 382a and switch 384a, and node 383b is shared by fixed unit capacitor 382b and switch 384b. Moreover, nodes 383a and 383b can be selectively coupled to a supply voltage, e.g., $V_{DD}$ by a common third switch 388 through respective resistors 386a and 386b which may be approximately forty kilo-ohm (40 kΩ) resistors, for example. That is to say, a first selectable fixed capacitance unit cell 380 comprises fixed unit capacitors 382a(1) and 382b(1), nodes 383a(1) and 383b(1), resistors 386a(1) and 386b(1), and switches 384a(1), 384b(1), and 388(1), and so forth, until finally the nth selectable fixed capacitance unit cell comprises fixed unit capacitors 382a(n) and 382b(n), nodes 383a(n) and 383b(n), resistors 386a(n) and 386b(n), and switches 384a(n), 384b(n), and 388(n).

Focusing on the first selectable fixed capacitance unit cell 380 comprising fixed unit capacitors 382a(1) and 382b(1), nodes 383a(1) and 383b(1), resistors 386a(1) and 386b(1), and switches 384a(1), 384b(1), and 388(1) as representative of the operation of each of the n selectable fixed capacitance unit cells comprised by variable capacitance tuning circuit 370, it is first noted that each of the switching devices is represented as an n-channel FET (NFET), such as a metal-insulator-semiconductor FET (MISFET) or N type metal-oxide-semiconductor (NMOS) switching device. That representation is merely exemplary, however, and other embodiments of variable capacitance tuning circuit 370 can be implemented using other types of switching devices.

Referring to the specific configuration shown in FIG. 3 to illustrate the operation of selectable fixed capacitance unit cell 380, according that embodiment, when switches 384a(1) and 384b(1), e.g., NMOS switches, receive a HIGH control signal at their respective gates, switch 388(1) is LOW and selectable fixed capacitance unit cell 380 is switched in. In that case the direct-current (DC) voltage of nodes 383a(1) and 383b(1) is at ground, and the alternating-current (AC) voltage at those nodes is almost zero. However, when switches 384a(1) and 384b(1) are controlled LOW, switch 388(1) is sent HIGH, and selectable fixed capacitance unit cell 380 is switched out. That is the case because when switches 384a(1) and 384b(1) are LOW while switch 388(1) is HIGH, fixed unit capacitors 382a(1) and 382b(1) are each in series with respective resistors 386a(1) and 386b(1), which may be very large. Consequently, at RF selectable fixed capacitance unit cell 380 presents a substantially open circuit when switches 384a(1) and 384b(1) are LOW while switch 388(1) is HIGH. Moreover, the DC voltage at nodes 383a(1) and 383b(1) is set to VDD, e.g. approximately 1.2V, which ensures that the junction diodes of MOS switches 384a(1) and 384b(1) remain reverse-biased.

Variable capacitance tuning circuit 370 may comprise any suitable number, n, of selectable fixed capacitance unit cells 380, such as from approximately twenty to approximately thirty [(~20)-(~30)] selectable fixed capacitance unit cells, for example. Implementation of variable capacitance tuning circuit 370 in a variable gain control transformer, such as variable gain control transformer 230, in FIG. 1, enables a single variable gain control transformer used for high-band or low-band transmission frequency operation to selectably support several or all of the multiple transmission modes used by a transmitter. Referring to FIG. 1 and the example embodiment in which transmitter 100 is configured to operate in any of W-CDMA, GSM, and EDGE transmission modes, for example, implementation of the architecture shown in FIG. 3 as variable capacitance tuning circuits 170a and 170b advantageously enables each of respective variable gain control transformers 130a and 130b to support all of the transmission modes used by transmitter 100.

Turning now to FIG. 4A, FIG. 4A is a diagram showing elements of output control circuit 441 suitable for implementation as part of a variable gain control transformer, according to one embodiment of the present invention. FIG. 4A shows variable gain control transformer 430 including primary winding 432, secondary winding 440, output control circuit 441, and outputs 442 and 444, corresponding to variable gain control transformer 230 including respective primary winding 232, secondary winding 240, output control circuit 241, and outputs 242 and 244, in FIG. 2. Also shown in FIG. 4A are variable resistors 446 and 448 providing respective variable resistances R1 and R2 and corresponding respectively to variable resistors 246 and 248, in FIG. 2.

In addition to variable resistors 446 and 448, which are represented as being implemented by respective switch pairs 452a and 452b, and 452c and 452d, the embodiment of output control circuit 441 shown in FIG. 4A also includes switches 462, 464, and 466, resistors 467a and 467b, and capacitors 468a, 468b, and 469. It is noted that each of the switching devices comprised by output control circuit 441 is represented as either an NFET or a PFET. For example, switches 464 and 466 are characterized as PFETs in FIG. 4A, while switches 452a, 452b, 452c, and 452d (hereinafter "switches 452a-452d), and switch 462 are each characterized as an NFET. As was the case for the circuit in FIG. 3, above, however, the representation shown FIG. 4A is merely exemplary, and other embodiments of output control circuit 441 may be arranged and adapted so as to use other types of switching devices.

According to the embodiment shown in FIG. 4A, each of variable resistors 446 and 448 are implemented by the source-drain resistances produced by their respective paired switches. For example, the resistance presented by variable resistor 446 corresponds to the source-drain resistances presented by its constituent plurality of switches 452a and 452b, each of which may be selectively activated independent of the other as shown by control signal CN3 applied to the control terminal of switch 452a and control signal CN4 applied to the control terminal of switch 452b. Thus, depending upon whether only one or the other of switches 452a and 452b is ON, or whether both switches are concurrently ON or OFF, the effective resistance provided by the source-drain resistances of switches 452a and 452b allow R1 of variable resistor 446 to be adjusted or varied. Analogously, the operation of switches 452c and 452d, also respectively controlled by control signals CN3 and CN4, produce the variable resistance R2 provided by variable resistor 448.

Referring to FIG. 4B, FIG. 4B is a diagram showing a sub-circuit for producing the variable resistances used in the output control circuit of FIG. 4A, according to one embodiment of the present invention. As shown in FIG. 4B, sub-circuit 450 includes matched current sources 454a and 454b, high-gain operational amplifier (op-amp) 456, calibrated resistor 458, and switch 452. Switch 452 can be seen to correspond to any of switches 452a-452d in FIG. 4A, for example. Thus, sub-circuit 450 can be implemented to provide any of the source-drain resistances produced by switches 452a-452d.

As further shown in FIG. 4B, the outputs of matched current sources 454a and 454b are respectively coupled to ground through switch 452 and calibrated resistor 458 presenting known resistance $R_N$, which can correspond to any desired resistance R1 or R2. In addition, the outputs of matched current sources 454a and 454b respectively feed opposite differential inputs to high-gain op-amp 456, while the output of high-gain op-amp 456 provides the control signal CN applied to the control terminal, e.g., gate, of FET switch 452. As a result, switch 452 corresponding to any of selectable FETs 452a-452d receives a control signal CN forcing its source-drain resistance to track the calibrated resistance of calibrated resistor 458 while switch 452 is ON.

Moreover, sub-circuit 450 ensures that the source-drain resistance across FET switch 452 will match the resistance of calibrated resistor 458 for a spectrum current values produced by matching current sources 454a and 454b. As a result, the source-drain resistance provided by FET switch 452 can be seen to be regulated by sub-circuit 450 so as to remain substantially constant over process-voltage-temperature (PVT) variations.

Figure 5:
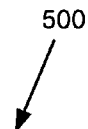
FIG. 5 is a table showing control signals used in conjunction with the output control circuit of FIG. 4A for producing variable gain control by the transformer, according to one embodiment of the present invention.

The operation of output control circuit 441, and therefore the variable gain control functionality of variable gain control transformer 430, in FIG. 4A, will now be further described by reference to FIG. 5. FIG. 5 presents table 500 showing control signals used in conjunction with output control circuit 441, in FIG. 4A, for producing variable gain control by transformer 430 in that figure, according to one embodiment of the present invention. Once again we return to the example embodiment in which the PA driver and transmitter comprising variable gain transformer 430, in FIG. 4A, are configured for multi-mode transmission using any one of W-CDMA, GSM, and EDGE transmission modes.

Referring concurrently to FIGS. 4A and 5, according to the embodiment represented by table 500, gain control by variable gain control transformer 430 is only required when transmission occurs in W-CDMA mode, e.g., EDGE and GSM modes require no preamplification signal attenuation by variable gain control transformer 430. As a result, EDGE and GSM transmission signals may be alternately taken from the same output of variable gain control transformer 430, e.g., output 444, while the opposite output, e.g., output 442, is AC grounded. That opposite output, e.g., output 442, can be used when W-CDMA transmission signals are produced, while the output used for EDGE and GSM modes, e.g., output 444, is AC grounded during W-CDMA mode operation.

According to table 500, when either of EDGE or GSM modes are in use, control signals CN1, CN2, CN3, and CN4, are LOW, while control signal CN5 is HIGH. Consequently, the constituent NFET switches of variable resistors 446 and 448 are turned OFF, as is NFET switch 462. Switches 464 and 466 are shown as PFETs, however, so that a HIGH CN5 applied to the switch 466 turns that device OFF, while the LOW CN2 signal results in PFET switch 464 being ON so as to AC ground output 442. As a result the EDGE or GSM mode transmission signals preamplified by the PA driver can be provided as single-ended outputs to the PA from output 444.

As further indicated by table 500, according to the present embodiment, three variable gain control levels are used in conjunction with W-CDMA mode: (1) maximum gain, e.g., no gain control attenuation, (2) approximately 6 dB of gain control, and (3) approximately 12 dB of gain control. For each variable gain control level provided by output control circuit 441, the W-CDMA mode output signals are provided to the PA as single-ended outputs from output 442.

For maximum gain in W-CDMA mode, control signal CN1 is HIGH, AC grounding output 444, while control signals CN3 and CN4 are LOW, so that switches 452a-452d are nominally OFF. In addition, control signal CN2 to PFET switch 464 is HIGH, assuring that switch being in an OFF state. Because, despite being nominally OFF, switches 452a and 452b of variable resistor 446 are AC coupled to output 442 at which relatively large voltage swings may occur during W-CDMA mode operation, biasing of switches 452a and 452b is provided by switch 466 and resistors 467a and 467b, which may be approximately twenty kilo-ohm (20 kΩ) resistors, for example. Due to implementation of a PFET as switch 466, a LOW control signal CN5 applied to switch 466 turns that device ON, thereby DC biasing the switches of variable resistor 446 to assure that their respective drain/source junction diodes remain reverse-biased during maximum gain W-CDMA mode operation.

When either approximately 6 dB or approximately 12 dB of gain control is desirable during W-CDMA mode operation, each of switches 462, 464, and 466 are turned OFF, while the constituent switches of variable resistors 446 and 448 are selectably activated to provide the desired amount of gain control. Thus, when 6 dB of gain control is required, control signal CN3 is HIGH, turning NFET switches 452a and 452c ON, and control signal CN4 is LOW, turning NFET switches 452b and 452d OFF. When, instead, 12 dB of gain control is desired, the status of control signals CN3 and CN4 is reversed, turning ON switches 452b and 452d, and turning OFF switches 452a and 452c. As a result of the described operation of output control circuit 441, variable gain control transformer 430 can provide up to approximately 12 dB of preamplification gain control.

Thus, the present application discloses embodiments of a variable gain control transformer suitable for implementation to provide preamplification gain control in a communications transmitter, for example, a transmitter used as part of a more modern mobile communication device transceiver. By introducing an output control circuit coupled to the secondary winding of PA driver output transformer, for example, embodiments of the present invention enable such a transformer to provide preamplification gain control. In addition, by utilizing variable resistors to selectably determine the gain control provided by the output control circuit, embodiments of the present invention enable variable gain control by the transformer across a spectrum of desirable gain control levels. Moreover, by utilizing a variable capacitance tuning circuit at the input of the variable gain control transformer, embodiments of the present invention enable a flexible architecture in which a single transformer may be used to provide variable gain control while supporting multiple transmission modes.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A variable gain control transformer comprising:
a primary winding connected to differential inputs of said variable gain control transformer;
a secondary winding configured to provide a single ended output to a load;
an output control circuit coupled to said secondary winding and comprising first and second variable resistors; and
a variable capacitance tuning circuit including a plurality of selectable fixed capacitance unit cells coupled between said differential inputs, wherein
said selectable fixed capacitance unit cells comprise first and second fixed unit capacitors each having a corresponding plate selectably coupled to ground by respective first and second switches, and
said first fixed unit capacitor and said second fixed unit capacitor are selectively coupled to a supply voltage by a common third switch.

2. The variable gain control transformer of claim 1, wherein said output control circuit is configured to substantially match an input impedance of said load.

3. The variable gain control transformer of claim 1, wherein a first node shared by said first fixed unit capacitor and said first switch, and a second node shared by said second fixed unit capacitor and said second switch are selectively coupled to said supply voltage by said common third switch.

4. The variable gain control transformer of claim 1, wherein said output control circuit is configured to provide up to approximately 12 dB of gain control.

5. The variable gain control transformer of claim 1, wherein said first and second variable resistors are implemented by respective first and second pluralities of source-drain resistances produced by respective corresponding first and second pluralities of selectable field-effect transistors (FETs).

6. The variable gain control transformer of claim 5, wherein each of said selectable FETs is configured to receive a control signal forcing its respective source-drain resistance to track a calibrated resistance while each of said selectable FETs is ON.

7. The variable gain control transformer of claim 1, wherein said variable gain control transformer is implemented as part of a power amplifier (PA) driver circuit in a radio frequency (RF) transmitter.

8. The variable gain control transformer of claim 7, wherein said variable gain control transformer is configured to selectably support a plurality of transmission modes of said RF transmitter.

9. The variable gain control transformer of claim 7, wherein said RF transmitter is implemented as part of an integrated mobile communications transceiver.

10. A radio frequency (RF) transmitter comprising:
a differentially driven power amplifier (PA) driver including a variable gain control transformer for providing a single ended output to a PA of said radio frequency transmitter;
an output control circuit comprising first and second variable resistors coupled to a secondary winding of said variable gain control transformer for providing a single ended output to drive said PA; and
a variable capacitance tuning circuit including a plurality of selectable fixed capacitance unit cells coupled between differential inputs of said variable gain control transformer, wherein
said selectable fixed capacitance unit cells comprise first and second fixed unit capacitors each having a corresponding plate selectably coupled to ground by respective first and second switches, and
said first fixed unit capacitor and said second fixed unit capacitor are selectively coupled to a supply voltage by a common third switch.

11. The RF transmitter of claim 10, wherein said variable gain control transformer is further configured to substantially match an input impedance of said PA.

12. The RF transmitter of claim 10,
wherein a first node shared by said first fixed unit capacitor and said first switch, and a second node shared by said second fixed unit capacitor and said second switch are selectively coupled to said supply voltage by said common third switch.

13. The RF transmitter of claim 10, wherein said output control circuit is configured to provide up to approximately 12 dB of gain control.

14. The RF transmitter of claim 10, wherein said first and second variable resistors are implemented by respective first and second pluralities of source-drain resistances produced by respective corresponding first and second pluralities of selectable field-effect transistors (FETs).

15. The RF transmitter of claim 14, wherein each of said selectable FETs is configured to receive a control signal forcing its respective source-drain resistance to track a calibrated resistance while each of said selectable FETs is ON.

16. The RF transmitter of claim 10, wherein said variable gain control transformer is configured to selectably support a plurality of transmission modes of said RF transmitter.

17. The RF transmitter of claim 16, wherein at least one of said plurality of transmission modes supports both voice-band and data-band communications.

18. The RF transmitter of claim 10, wherein said RF transmitter is implemented as part of an integrated mobile communications transceiver.

19. An electronic device comprising:
a variable gain control transformer; and
a variable capacitance tuning circuit including a plurality of selectable fixed capacitance unit cells coupled between differential inputs of said variable gain control transformer, wherein
said selectable fixed capacitance unit cells comprise first and second fixed unit capacitors each having a corresponding plate selectably coupled to ground by respective first and second switches, and
said first fixed unit capacitor and said second fixed unit capacitor are selectively coupled to a supply voltage by a third switch.

* * * * *